(12) United States Patent
Jian et al.

(10) Patent No.: US 12,041,751 B2
(45) Date of Patent: Jul. 16, 2024

(54) IMMERSION COOLING SYSTEM

(71) Applicant: DELTA ELECTRONICS, INC., Taoyuan (TW)

(72) Inventors: Yan-Hui Jian, Taoyuan (TW); Chiu-Chin Chang, Taoyuan (TW); Wei-Chih Lin, Taoyuan (TW); Ren-Chun Chang, Taoyuan (TW); Chih-Hung Tsai, Taoyuan (TW); Li-Hsiu Chen, Taoyuan (TW); Wen-Yin Tsai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 203 days.

(21) Appl. No.: 17/662,080

(22) Filed: May 5, 2022

(65) Prior Publication Data
US 2023/0023554 A1 Jan. 26, 2023

Related U.S. Application Data

(60) Provisional application No. 63/223,984, filed on Jul. 21, 2021.

(30) Foreign Application Priority Data
Jan. 11, 2022 (CN) .......................... 202210024713.6

(51) Int. Cl.
*H05K 7/20* (2006.01)
(52) U.S. Cl.
CPC ......... *H05K 7/203* (2013.01); *H05K 7/20318* (2013.01); *H05K 7/20327* (2013.01)

(58) Field of Classification Search
CPC ............... H05K 7/203; H05K 7/20318; H05K 7/20327; H05K 7/20236; G06F 1/20
See application file for complete search history.

(56) References Cited

U.S. PATENT DOCUMENTS

| | | | |
|---|---|---|---|
| 8,713,955 B2 * | 5/2014 | Campbell | .......... H05K 7/20327 62/259.1 |
| 8,713,957 B2 | 5/2014 | Campbell et al. | |

(Continued)

FOREIGN PATENT DOCUMENTS

| | | |
|---|---|---|
| CN | 200974767 Y | 11/2007 |
| GB | 2389174 A | 12/2003 |

(Continued)

*Primary Examiner* — Stephen S Sul
*Assistant Examiner* — Jeffrey Francis Stoll
(74) *Attorney, Agent, or Firm* — CKC & Partners Co., LLC (57) ABSTRACT

An immersion cooling system includes a tank, an isolation plate and a condenser. The tank includes a base plate and a sidewall connected with the base plate. The sidewall defines with the base plate a space configured to accommodate a cooling liquid. The isolation plate connects with the sidewall or the base plate and divides the space into a first subsidiary space and a second subsidiary space. The first subsidiary space is configured to accommodate electronic equipment which is immersed in the cooling liquid. The isolation plate and the base plate are separated from each other. The sidewall surrounds the condenser. A vertical projection of the condenser towards the base plate at least partially overlaps with the second subsidiary space. The electronic equipment evaporates a portion of the cooling liquid to form a vapor. The condenser is configured to condense the vapor into a liquid form.

14 Claims, 6 Drawing Sheets

(56) References Cited

U.S. PATENT DOCUMENTS

| | | | |
|---|---|---|---|
| 9,351,429 B2 | 5/2016 | Shelnutt et al. | |
| 9,844,166 B2 | 12/2017 | Shelnutt et al. | |
| 10,143,113 B2 | 11/2018 | Shelnutt et al. | |
| 10,206,307 B2 | 2/2019 | Lau | |
| 10,321,603 B1 * | 6/2019 | Banerjee | H05K 7/20318 |
| 10,773,192 B1 | 9/2020 | Lau | |
| 10,966,349 B1 * | 3/2021 | Lau | H05K 7/20236 |
| 2015/0070846 A1 | 3/2015 | Shelnutt et al. | |
| 2016/0345461 A1 | 11/2016 | Smith | |
| 2019/0014685 A1 | 1/2019 | So et al. | |
| 2019/0159360 A1 | 5/2019 | Uchida | |
| 2019/0357378 A1 | 11/2019 | Kolar et al. | |
| 2019/0357379 A1 | 11/2019 | Kolar | |
| 2020/0305310 A1 | 9/2020 | Alissa et al. | |
| 2021/0219455 A1 | 7/2021 | Lau | |

FOREIGN PATENT DOCUMENTS

| | | |
|---|---|---|
| TW | I633407 B | 8/2018 |
| TW | I640239 B | 11/2018 |
| TW | 202020385 A | 6/2020 |
| TW | M610160 U | 4/2021 |

\* cited by examiner

IMMERSION COOLING SYSTEM

RELATED APPLICATIONS

This application claims priority to U.S. Provisional Application Ser. No. 63/223,984 filed Jul. 21, 2021 and Chinese Application Serial Number 202210024713.6 filed Jan. 11, 2022, which are herein incorporated by reference.

BACKGROUND

Technical Field

The present disclosure relates to immersion cooling systems.

Description of Related Art

During the operation of large electronic equipment, in order to avoid the reduction of operational performance and even damage due to its generation of excessive heat, the way to carry out effective heat dissipation for the large electronic equipment under a reliable condition is undoubtedly an important issue to the industry.

In the application of immersion cooling system, a user will immerse the large electronic equipment into the cooling liquid inside the immersion cooling system, in order to deliver away the heat generated by the electronic equipment during operation.

SUMMARY

A technical aspect of the present disclosure is to provide an immersion cooling system, which can prevent electronic equipment from being splashed and damaged by water from different sources in the tank.

According to an embodiment of the present disclosure, an immersion cooling system includes a tank, an isolation plate and a condenser. The tank includes a base plate and a sidewall. The sidewall is connected with the base plate and defines a space together with the base plate. The space is configured to accommodate a cooling liquid. The isolation plate is connected with the sidewall or the base plate and divides the space into a first subsidiary space and a second subsidiary space. The first subsidiary space is configured to accommodate at least one unit of electronic equipment such that the electronic equipment is immersed in the cooling liquid. The isolation plate and the base plate are at least partially separated from each other. The condenser is surrounded by the sidewall. A vertical projection of the condenser towards the base plate is at least partially overlapped with the second subsidiary space. The electronic equipment evaporates a portion of the cooling liquid to form a vapor. The condenser is configured to condense the vapor into a liquid form.

In one or more embodiments of the present disclosure, the immersion cooling system further includes a water detector. The water detector is connected with either the isolation plate or the sidewall and located within the second subsidiary space. The water detector is configured to detect an existence of water.

In one or more embodiments of the present disclosure, the immersion cooling system further includes a display device. The display device is signally connected with the water detector and configured to display whether the water detector detects the existence of water.

In one or more embodiments of the present disclosure, the immersion cooling system further includes a top plate. The top plate is connected with the sidewall and is opposite to the base plate. The isolation plate and the top plate are separated from each other.

In one or more embodiments of the present disclosure, the immersion cooling system further includes at least one supporting piece. The supporting piece is connected between the isolation plate and the top plate.

In one or more embodiments of the present disclosure, the immersion cooling system further includes at least one supporting piece. The supporting piece is connected between the isolation plate and the base plate.

In one or more embodiments of the present disclosure, the isolation plate includes a first subsidiary isolation plate and a second subsidiary isolation plate. The first subsidiary isolation plate and the second subsidiary isolation plate are connected with each other to form an included angle. The first subsidiary isolation plate and the base plate are separated from each other. The second subsidiary isolation plate and the base plate are connected with each other.

In one or more embodiments of the present disclosure, the immersion cooling system further includes at least one supporting piece. The supporting piece is connected between the first subsidiary isolation plate and the base plate.

In one or more embodiments of the present disclosure, the isolation plate is substantially perpendicular to the base plate.

In one or more embodiments of the present disclosure, the condenser includes an input port, an output port and a main body. The input port and the output port are respectively communicated with the main body. The input port is configured to allow a cooling water to flow into the main body. The output port is configured to allow the cooling water to flow away from the main body. The main body is configured to condense the vapor into the liquid form.

According to an embodiment of the present disclosure, an immersion cooling system includes a tank, an isolation plate, a condenser and a water detector. The tank includes a base plate and a sidewall. The sidewall is connected with the base plate and defines a space together with the base plate. The space is configured to accommodate a cooling liquid. The isolation plate is connected with the sidewall and forms at least one first passage with the base plate therebetween. The isolation plate divides the space into a first subsidiary space and a second subsidiary space communicated with the first subsidiary space through the first passage. The first subsidiary space is configured to accommodate at least one unit of electronic equipment such that the electronic equipment is immersed in the cooling liquid. The condenser is located at least partially in the second subsidiary space and above the cooling liquid in the tank. The water detector is located within the second subsidiary space and below the condenser. The water detector is configured to detect an existence of water. The electronic equipment evaporates a portion of the cooling liquid to form a vapor. The condenser is configured to condense the vapor into a liquid form.

In one or more embodiments of the present disclosure, the immersion cooling system further includes a display device. The display device is signally connected with the water detector and is configured to display whether the water detector detects the existence of water.

In one or more embodiments of the present disclosure, the immersion cooling system further includes a top plate. The top plate is connected with the sidewall. The isolation plate and the top plate form at least one second passage therebetween.

In one or more embodiments of the present disclosure, the immersion cooling system further includes at least one supporting piece. The supporting piece is connected between the isolation plate and the top plate.

In one or more embodiments of the present disclosure, the immersion cooling system further includes at least one supporting piece. The supporting piece is connected between the isolation plate and the base plate.

In one or more embodiments of the present disclosure, the isolation plate includes a first subsidiary isolation plate and a second subsidiary isolation plate perpendicularly connected with the first subsidiary isolation plate. The first subsidiary isolation plate and the base plate are separated from each other. The second subsidiary isolation plate and the base plate are connected with each other.

In one or more embodiments of the present disclosure, the immersion cooling system further includes at least one supporting piece. The supporting piece is connected between the first subsidiary isolation plate and the base plate.

In one or more embodiments of the present disclosure, the isolation plate is substantially perpendicular to the base plate.

In one or more embodiments of the present disclosure, the condenser includes an input port, an output port and a main body. The input port and the output port are respectively communicated with the main body. The input port is configured to allow a cooling water to flow into the main body. The output port is configured to allow the cooling water to flow away from the main body. The main body is configured to condense the vapor into the liquid form.

According to an embodiment of the present disclosure, an immersion cooling system includes a tank, an isolation plate, a condenser and a water detector. The tank defines a space configured to accommodate a cooling liquid. The isolation plate is connected between two opposite inner walls of the tank and has at least one through hole near a bottom of the tank. The isolation plate divides the space into a first subsidiary space and a second subsidiary space communicated with the first subsidiary space via the through hole. The first subsidiary space is configured to accommodate at least one unit of electronic equipment such that the electronic equipment is immersed in the cooling liquid. The condenser is located at least partially in an upper portion of the second subsidiary space in the tank. The water detector is connected with one of the inner walls and is located within the second subsidiary space. The water detector is configured to detect an existence of water. The electronic equipment evaporates a portion of the cooling liquid to form a vapor. The condenser is configured to condense the vapor into a liquid form.

The above-mentioned embodiments of the present disclosure have at least the following advantages:

(1) Even if a certain amount of water vapor is present in the tank and the condenser condenses this original water vapor in the tank to form water droplets, during the dripping process of the water droplets, the water droplets also flow to the cooling liquid located in the second subsidiary space to accumulate as liquid water, and do not splash to the first subsidiary space due to the obstruction by the isolation plate. In other words, even if the condenser condenses the water vapor present in the tank to form water droplets, the electronic equipment accommodated in the first subsidiary space will not be splashed by these water droplets due to the obstruction by the isolation plate. Therefore, the chance that the electronic equipment to be contacted by the water because of the presence of the water vapor in the tank is avoided. Thus, the risk of damage of the electronic equipment is reduced.

(2) In case there is leakage of cooling water from the condenser due to different reasons, the cooling water leaked from the condenser flows to the cooling liquid located in the second subsidiary space to accumulate as liquid water, and does not splash to the first subsidiary space due to the obstruction by the isolation plate. In other words, even if there is leakage of cooling water from the condenser, the electronic equipment accommodated in the first subsidiary space will not be splashed by the cooling water leaked from the condenser due to the obstruction by the isolation plate. Therefore, the chance that the electronic equipment to be contacted by the cooling water because of the leakage from the condenser is avoided. Thus, the risk of damage of the electronic equipment is reduced.

(3) In case there are different sources of water in the tank, the water will then flow to the cooling liquid located in the second subsidiary space, and the water detector will detect if the water exists. The display device is signally connected with the water detector and is configured to display whether the water detector detects the existence of water. In this way, a user can find out if there are different sources of water in the tank through the display device in a simple and easy manner.

BRIEF DESCRIPTION OF THE DRAWINGS

The disclosure can be more fully understood by reading the following detailed description of the embodiments, with reference made to the accompanying drawings as follows.

DETAILED DESCRIPTION

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
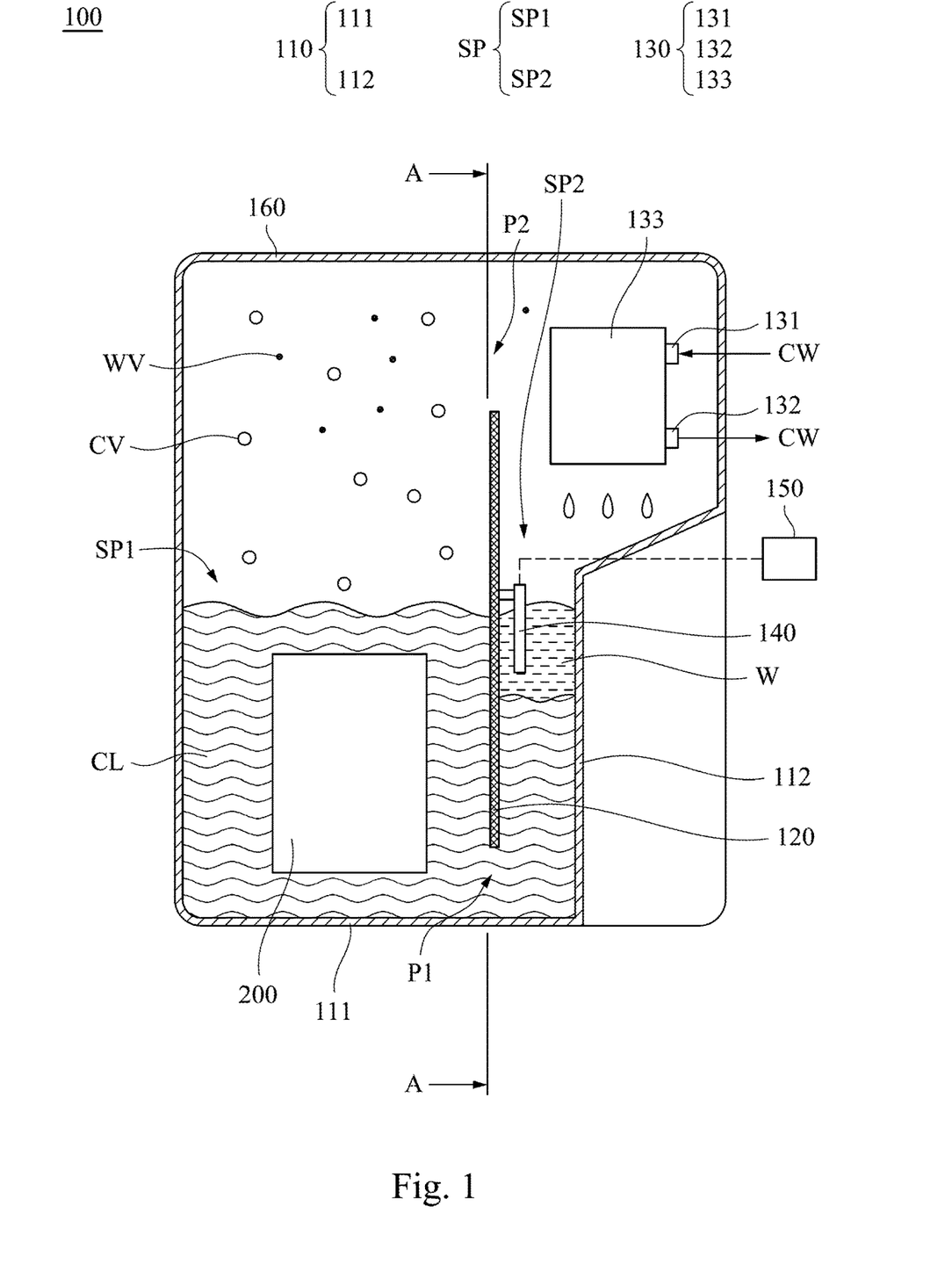
FIG. 1 is a sectional view of an immersion cooling system according to an embodiment of the present disclosure.
Figure 2:
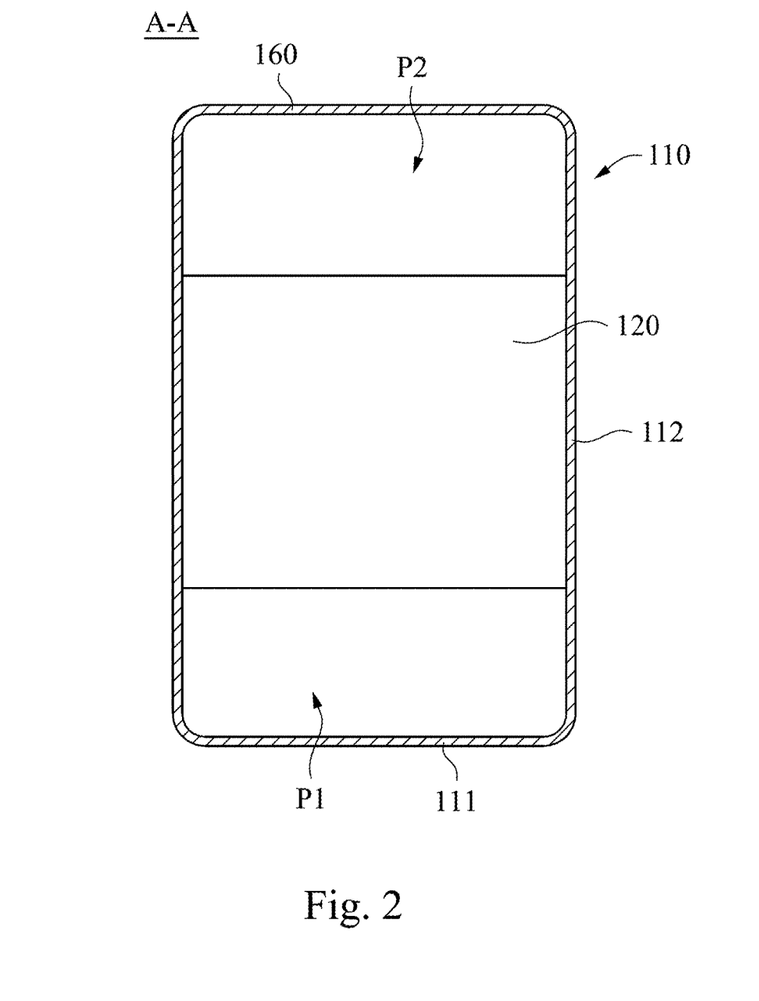
FIG. 2 is a cross-sectional view along the sectional line A-A of FIG. 1.

Reference is made to FIGS. 1-2. FIG. 1 is a sectional view of an immersion cooling system 100 according to an embodiment of the present disclosure. FIG. 2 is a cross-sectional view along the sectional line A-A of FIG. 1. In this embodiment, as shown in FIGS. 1-2, an immersion cooling system 100 includes a tank 110, an isolation plate 120 and a condenser 130. The tank 110 includes a base plate 111 and a sidewall 112. The sidewall 112 is connected with the base plate 111 and defines a space SP together with the base plate 111. The space SP is configured to accommodate a cooling liquid CL. The isolation plate 120 is connected with the sidewall 112 (or directly connected with the base plate 111 in other embodiments) and divides the space SP into a first subsidiary space SP1 and a second subsidiary space SP2. In other words, the first subsidiary space SP1 is defined and extended from one side of the isolation plate 120, and the second subsidiary space SP2 is defined and extended from the opposite side of the isolation plate 120. Both of the first subsidiary space SP1 and the second subsidiary space SP2 are configured to accommodate the cooling liquid CL. Moreover, the first subsidiary space SP1 is configured to accommodate at least one unit of electronic equipment 200, such that the electronic equipment 200 is immersed in the cooling liquid CL for heat dissipation. It is worth to note that the isolation plate 120 and the base plate 111 are at least partially separated from each other, and the isolation plate 120 and the base plate 111 define a passage P1 therebetween. This means that the first subsidiary space SP1 and the second subsidiary space SP2 are communicated with each other through the passage P1. Therefore, the cooling liquid CL can flow between the first subsidiary space SP1 and the second subsidiary space SP2 through the passage P1. The condenser 130 is located in the space SP of the tank 110. To be specific, the condenser 130 is located at least partially in the second subsidiary space SP2 and above the cooling liquid CL in the tank 110. In other words, the condenser 130 is located at least partially in an upper portion of the second subsidiary space SP2 in the tank 110. The condenser 130 is surrounded by the sidewall 112. A vertical projection of the condenser 130 towards the base plate 111 is at least partially overlapped with the second subsidiary space SP2. In FIG. 1, the condenser 130 is totally set up in the second subsidiary space SP2.

During the operation of the electronic equipment 200, the electronic equipment 200 generates heat. The hot electronic equipment 200 evaporates a portion of the cooling liquid CL to form a vapor CV. The vapor CV being heated up floats upwards and leaves from the cooling liquid CL. The condenser 130 is configured to condense the vapor CV into a liquid form, such that the vapor CV reverts to the cooling liquid CL originally in a liquid form. As mentioned above, since a vertical projection of the condenser 130 towards the base plate 111 is at least partially overlapped with the second subsidiary space SP2, the cooling liquid CL condensed and reverted by the condenser 130 drips downwards due to its weight and flows back to the cooling liquid CL located in the second subsidiary space SP2. Through repeated conversions between the gas form and the liquid form of the cooling liquid CL, a fluid circulation is formed in the space SP of the tank 110.

It is worth to note that, since the isolation plate 120 at least partially obstructs between the first subsidiary space SP1 and the second subsidiary space SP2, during the dripping process of the cooling liquid CL condensed and reverted by the condenser 130, the cooling liquid CL dripped downwards flows back to the cooling liquid CL located in the second subsidiary space SP2, and does not splash to the first subsidiary space SP1 due to the obstruction by the isolation plate 120.

In this way, even if a certain amount of water vapor WV is present in the tank 110 and the condenser 130 condenses this original water vapor WV in the tank 110 to form water droplets, during the dripping process of the water droplets, the water droplets also flow to the cooling liquid CL located in the second subsidiary space SP2 to accumulate as liquid water W, and do not splash to the first subsidiary space SP1 due to the obstruction by the isolation plate 120. In other words, even if the condenser 130 condenses the water vapor WV present in the tank 110 to form water droplets, the electronic equipment 200 accommodated in the first subsidiary space SP1 will not be splashed by these water droplets due to the obstruction by the isolation plate 120. Therefore, the chance that the electronic equipment 200 to be contacted by the water W because of the presence of the water vapor WV in the tank 110 is avoided. Thus, the risk of damage of the electronic equipment 200 is reduced.

In addition, as shown in FIG. 1, the condenser 130 includes an input port 131, an output port 132 and a main body 133. The input port 131 and the output port 132 are respectively communicated with the main body 133. To be specific, a vertical projection of the main body 133 towards the base plate 111 is at least partially overlapped with the second subsidiary space SP2. The input port 131 is configured to allow a cooling water CW to flow into the main body 133. The output port 132 is configured to allow the cooling water CW to flow away from the main body 133. As the cooling liquid CL flows through the main body 133, the main body 133 of the condenser 130 is configured to condense the vapor CV into the liquid form. In practical applications, for example, the main body 133 of the condenser 130 can be assembled from a plurality of pipes. In case there are problems such as corrosion or poor connection of the pipes of the condenser 130, which causes a leakage of the cooling water CW, similarly, the cooling water CW leaked from the condenser 130 also flows to the cooling liquid CL located in the second subsidiary space SP2 to accumulate as liquid water W, and does not splash to the first subsidiary space SP1 due to the obstruction by the isolation plate 120. In other words, even if there is leakage of cooling water CW from the condenser 130, the electronic equipment 200 accommodated in the first subsidiary space SP1 will not be splashed by the cooling water CW leaked from the condenser 130 due to the obstruction by the isolation plate 120. Therefore, the chance that the electronic equipment 200 to be contacted by the water W (i.e., the cooling water CW) because of the leakage from the condenser 130 is avoided. Thus, the risk of damage of the electronic equipment 200 is reduced.

In practical applications, the cooling liquid CL can be an insulating dielectric fluid. The dielectric fluid and the water W are immiscible with each other, and a weight of water W is lighter than the dielectric fluid. Thus, the water W flowing to the cooling liquid CL located in the second subsidiary space SP2 floats above the dielectric fluid (i.e., the cooling liquid CL). In this way, the water W cannot flow from the second subsidiary space SP2 to the first subsidiary space SP1 through the passage P1 near the base plate 111, but the dielectric fluid located underneath the water W can flow from the second subsidiary space SP2 to the first subsidiary space SP1 through the passage P1. Thus, the fluid circulation of the dielectric fluid (i.e., the cooling liquid CL) in the tank 110 is kept smooth.

In practical applications, the isolation plate 120 is substantially perpendicular to the base plate 111. Therefore, when a user places the electronic equipment 200 into the first subsidiary space SP1 or takes the electronic equipment 200 away from the first subsidiary space SP1, the electronic equipment 200 will not easily collide with the isolation plate 120. Thus, the risk of damage of the electronic equipment 200 due to collision is reduced.

Moreover, as shown in FIG. 1, the immersion cooling system 100 further includes a top plate 160. The top plate 160 is connected with sidewall 112 and is opposite to the base plate 111. In other words, the sidewall 112 is connected between the top plate 160 and the base plate 111. The isolation plate 120 and the top plate 160 are separated from each other. The isolation plate 120 and the top plate 160 define a passage P2 therebetween. Therefore, the vapor CV formed from the evaporation of the cooling liquid CL by the electronic equipment 200 can flow from the first subsidiary space SP1 to the second subsidiary space SP2 through the passage P2, which facilitates the main body 133 of the condenser 130 to condense the vapor CV.

Furthermore, the immersion cooling system 100 further includes a water detector 140 and a display device 150. As shown in FIG. 1, the water detector 140 is connected with the isolation plate 120 and located within the second subsidiary space SP2. Furthermore, the water detector 140 is at least partially located below the condenser 130. The water detector 140 is configured to detect an existence of water W. As mentioned above, in case there are different sources of water W in the tank 110, the water W will then flow to the cooling liquid CL located in the second subsidiary space SP2, and the water detector 140 will detect if the water W exists. In addition, the display device 150 is signally connected with the water detector 140 and is configured to display whether the water detector 140 detects the existence of water W. In this way, a user can find out if there are different sources of water in the tank 110 through the display device 150 in a simple and easy manner.

Figure 3:
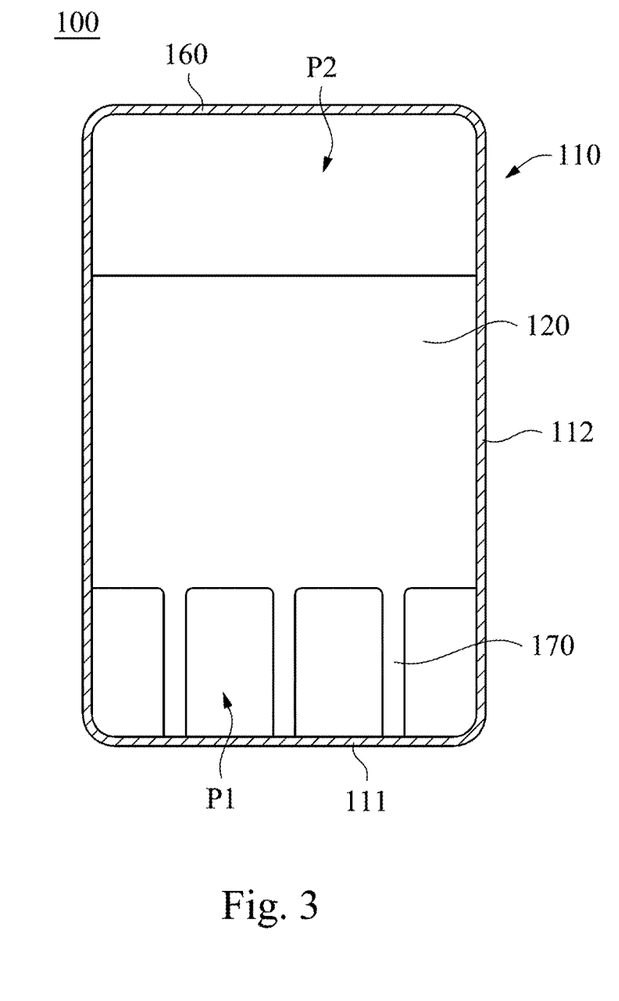
FIG. 3 is a sectional view of an immersion cooling system according to another embodiment of the present disclosure.

Reference is made to FIG. 3. FIG. 3 is a sectional view of an immersion cooling system 100 according to another embodiment of the present disclosure. In this embodiment, the immersion cooling system 100 further includes at least one supporting piece 170. The supporting piece 170 is connected between the isolation plate 120 and the base plate 111, in order to increase the structural strength between the isolation plate 120 and the base plate 111. For example, as shown in FIG. 3, a quantity of the supporting piece 170 can be plural.

Figure 4:
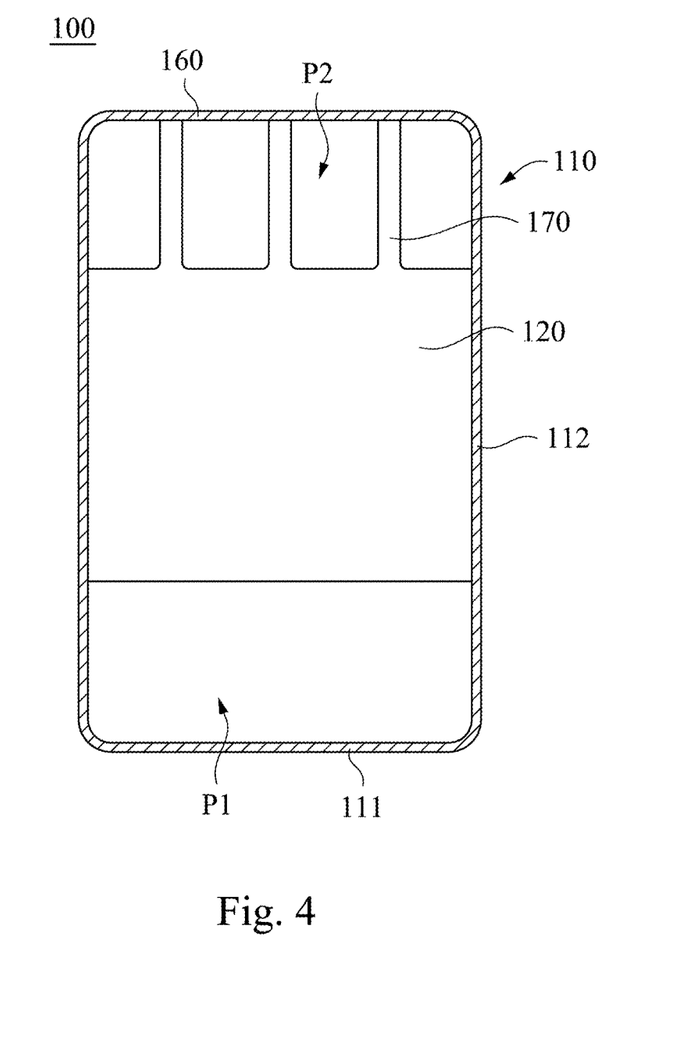
FIG. 4 is a sectional view of an immersion cooling system according to a further embodiment of the present disclosure.

Reference is made to FIG. 4. FIG. 4 is a sectional view of an immersion cooling system 100 according to another embodiment of the present disclosure. In this embodiment, the supporting piece 170 is connected between the isolation plate 120 and the top plate 160, in order to increase the structural strength between the isolation plate 120 and the top plate 160. For example, as shown in FIG. 4, a quantity of the supporting piece 170 can be plural. In other embodiments, the position of the supporting piece 170, apart from the positions as shown in FIGS. 3 and 4, according to the actual situation, can be connected between the isolation plate 120 and the sidewall 112, in order to increase the structural strength between the isolation plate 120 and the sidewall 112.

Figure 5:
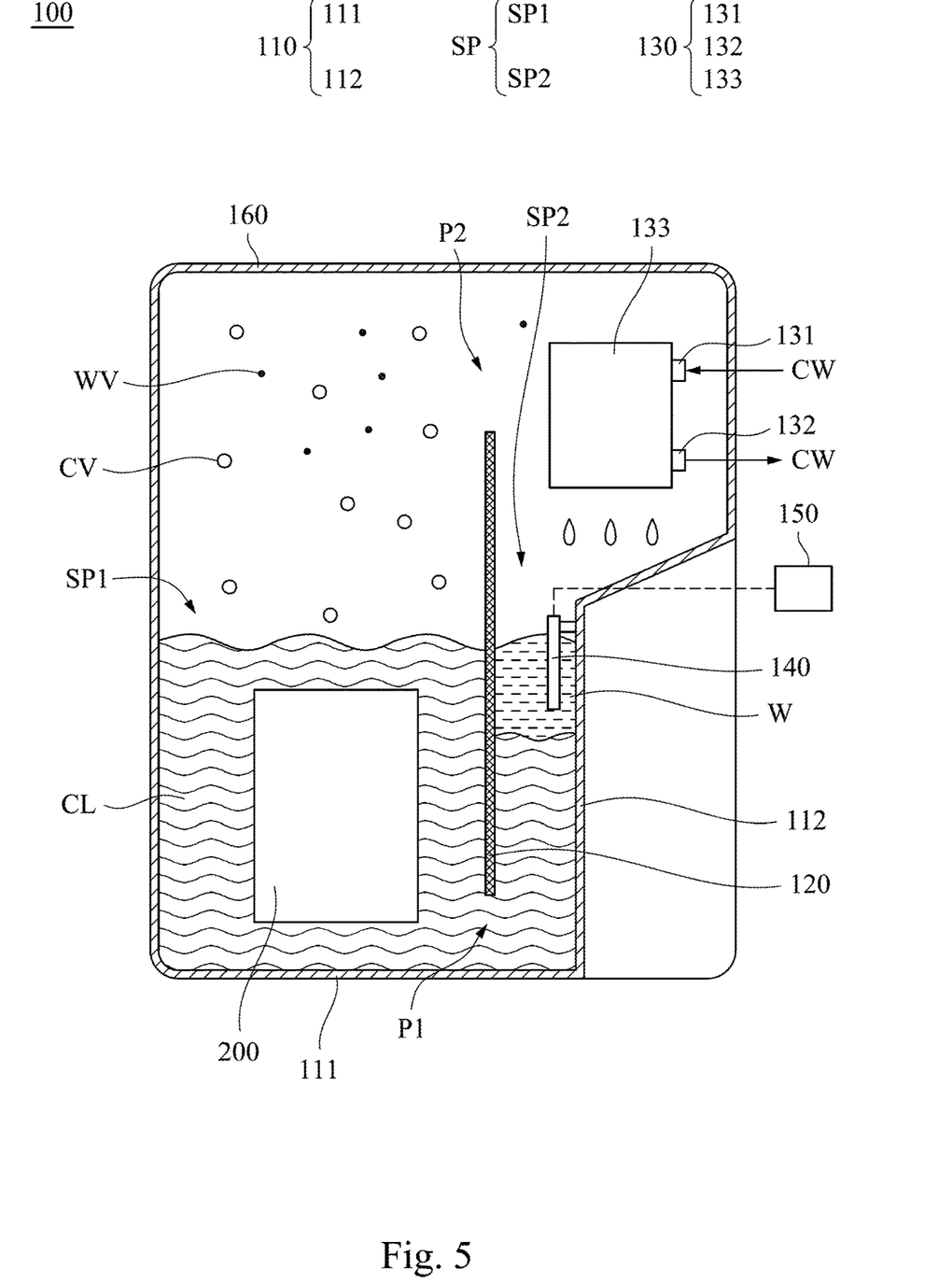
FIG. 5 is a sectional view of an immersion cooling system according to another embodiment of the present disclosure.

Reference is made to FIG. 5. FIG. 5 is a sectional view of an immersion cooling system 100 according to another embodiment of the present disclosure. In this embodiment, as shown in FIG. 5, the water detector 140 can also be connected with the sidewall 112 and located within the second subsidiary space SP2. Thus, the application flexibility of the water detector 140 can be increased.

Figure 6:
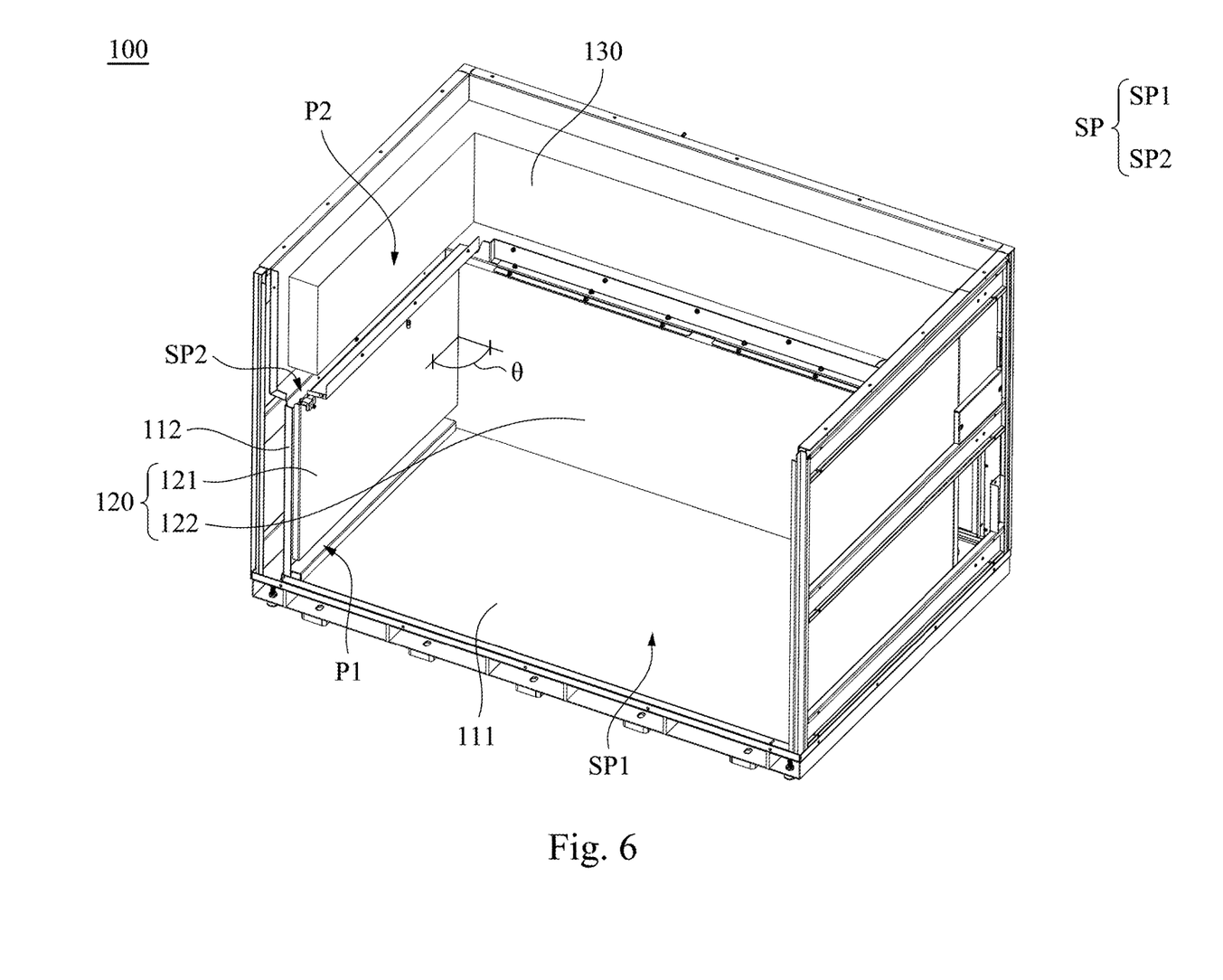
FIG. 6 is a sectional view of an immersion cooling system according to a further embodiment of the present disclosure.

Reference is made to FIG. 6. FIG. 6 is a sectional view of an immersion cooling system 100 according to another embodiment of the present disclosure. In this embodiment, as shown in FIG. 6, the isolation plate 120 includes a first subsidiary isolation plate 121 and a second subsidiary isolation plate 122. The first subsidiary isolation plate 121 and the second subsidiary isolation plate 122 are connected with each other to form an included angle θ. For example, the included angle θ can be 90 degrees. Thus, the isolation plate 120 can match with the L-shaped condenser 130 disposed on the sidewall 112. The first subsidiary isolation plate 121 and the base plate 111 are separated from each other. The first subsidiary isolation plate 121 and the base plate 111 define a passage P1 therebetween. The second subsidiary isolation plate 122 and the base plate 111 are connected with each other.

Figure 7:
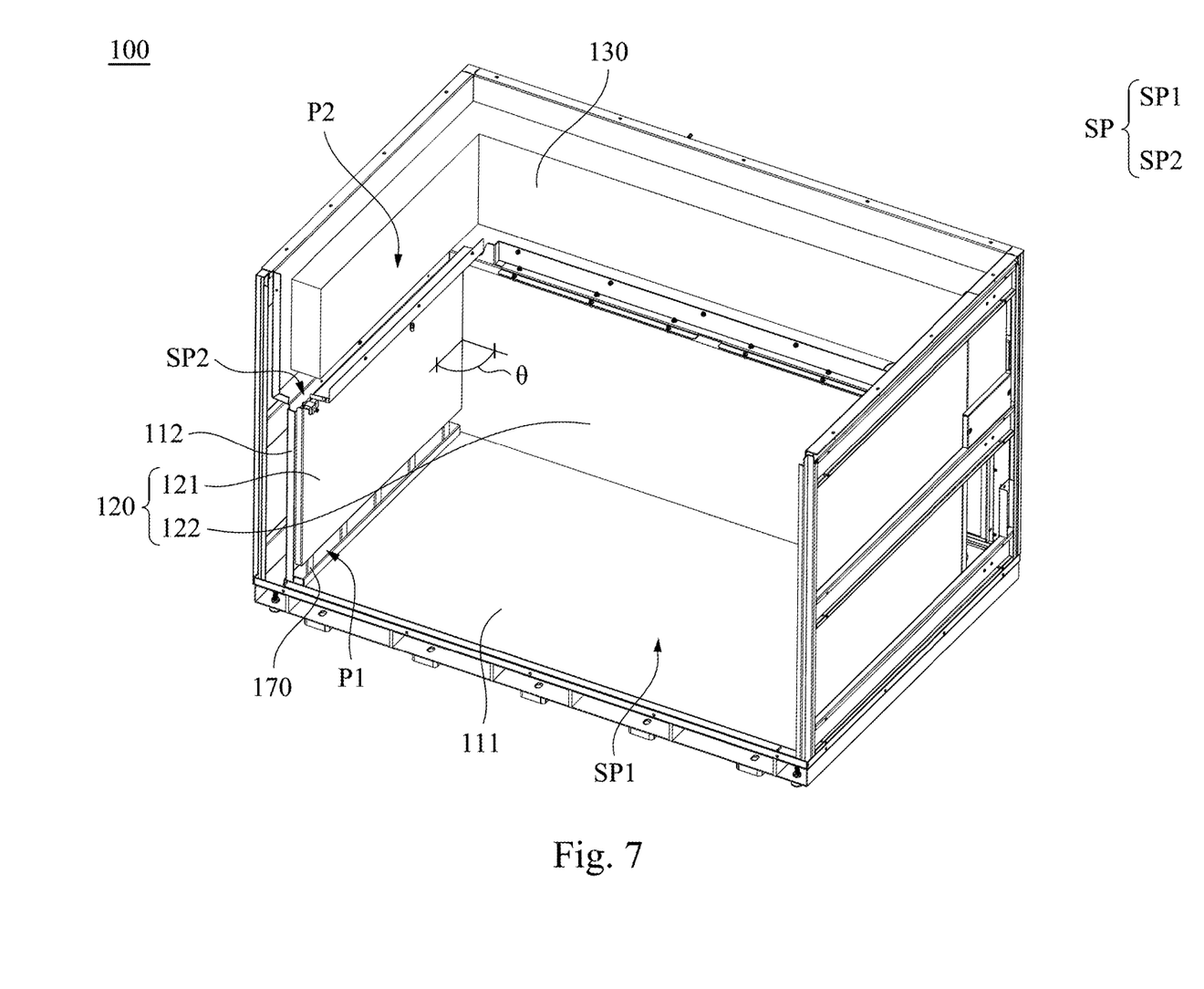
FIG. 7 is a sectional view of an immersion cooling system according to another embodiment of the present disclosure.

Reference is made to FIG. 7. FIG. 7 is a sectional view of an immersion cooling system 100 according to another embodiment of the present disclosure. In this embodiment, the immersion cooling system 100 further includes at least one supporting piece 170. The supporting piece 170 is connected between the first subsidiary isolation plate 121 and the base plate 111, in order to increase the structural strength between the isolation plate 120 and the base plate 111. For example, as shown in FIG. 7, a quantity of the supporting piece 170 can be plural.

In conclusion, the aforementioned embodiments of the present disclosure have at least the following advantages:

(1) Even if a certain amount of water vapor is present in the tank and the condenser condenses this original water vapor in the tank to form water droplets, during the dripping process of the water droplets, the water droplets also flow to the cooling liquid located in the second subsidiary space to accumulate as liquid water, and do not splash to the first subsidiary space due to the obstruction by the isolation plate. In other words, even if the condenser condenses the water vapor present in the tank to form water droplets, the electronic equipment accommodated in the first subsidiary space will not be splashed by these water droplets due to the obstruction by the isolation plate. Therefore, the chance that the electronic equipment to be contacted by the water because of the presence of the water vapor in the tank is avoided. Thus, the risk of damage of the electronic equipment is reduced.

(2) In case there is leakage of cooling water from the condenser due to different reasons, the cooling water leaked from the condenser flows to the cooling liquid located in the second subsidiary space to accumulate as liquid water, and does not splash to the first subsidiary space due to the obstruction by the isolation plate. In other words, even if there is leakage of cooling water from the condenser, the electronic equipment accommodated in the first subsidiary space will not be splashed by the cooling water leaked from the condenser due to the obstruction by the isolation plate. Therefore, the chance that the electronic equipment to be contacted by the cooling water because of the leakage from the condenser is avoided. Thus, the risk of damage of the electronic equipment is reduced.

(3) In case there are different sources of water in the tank, the water will then flow to the cooling liquid located in the second subsidiary space, and the water detector will detect if the water exists. The display device is signally connected with the water detector and is configured to display whether the water detector detects the existence of water. In this way, a user can find out if there are different sources of water in the tank through the display device in a simple and easy manner.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An immersion cooling system, comprising:
a tank, comprising:
a base plate; and
a sidewall connected with the base plate and defining a space together with the base plate, the space being configured to accommodate a cooling liquid;
an isolation plate connected with the sidewall or the base plate and dividing the space into a first subsidiary space and a second subsidiary space, the first subsidiary space being configured to accommodate at least one electronic equipment such that the at least one electronic equipment is immersed in the cooling liquid, the isolation plate and the base plate being at least partially separated from each other;
at least one first supporting piece connected between the isolation plate and the base plate; and
a condenser surrounded by the sidewall, a vertical height of which towards the base plate is at least partially overlapped with the second subsidiary space,
wherein the at least one electronic equipment evaporates a portion of the cooling liquid to form a vapor, and the condenser is configured to condense the vapor into a liquid form.

2. The immersion cooling system of claim 1, further comprising:
a water detector connected with either the isolation plate or the sidewall and located within the second subsidiary space, the water detector being configured to detect an existence of water.

3. The immersion cooling system of claim 2, further comprising:
a display device signally connected with the water detector and configured to display whether the water detector detects the existence of water.

4. The immersion cooling system of claim 1, further comprising:
a top plate connected with the sidewall and being opposite to the base plate, the isolation plate and the top plate being separated from each other.

5. The immersion cooling system of claim 1, wherein the isolation plate comprises a first subsidiary isolation plate and a second subsidiary isolation plate, the first subsidiary isolation plate and the second subsidiary isolation plate are connected with each other to form an included angle, the first subsidiary isolation plate and the base plate are separated from each other, and the second subsidiary isolation plate and the base plate are connected with each other.

6. The immersion cooling system of claim 5, wherein the first
supporting piece is connected between the first subsidiary isolation plate and the base plate.

7. The immersion cooling system of claim 1, wherein the isolation plate is substantially perpendicular to the base plate.

8. The immersion cooling system of claim 1, wherein the condenser comprises an input port, an output port and a main body, the input port and the output port are respectively communicated with the main body, the input port is configured to allow a cooling water to flow into the main body, the output port is configured to allow the cooling water to flow away from the main body, and the main body is configured to condense the vapor into the liquid form.

9. An immersion cooling system, comprising:
a tank, comprising:
a base plate; and
a sidewall connected with the base plate and defining a space together with the base plate, the space being configured to accommodate a cooling liquid;
an isolation plate connected with the sidewall and forming at least one first passage with the base plate therebetween, the isolation plate dividing the space into a first subsidiary space and a second subsidiary space communicated with the first subsidiary space through the first passage, the first subsidiary space being configured to accommodate at least one electronic equipment such that the at least one electronic equipment is immersed in the cooling liquid;
a top plate connected with the sidewall, the isolation plate and the top plate forming at least one second passage therebetween;
at least one first supporting piece connected between the isolation plate and the top plate;
a condenser located at least partially in the second subsidiary space and above the cooling liquid in the tank; and
a water detector located within the second subsidiary space and below the condenser, and being configured to detect an existence of water,
wherein the at least one electronic equipment evaporates a portion of the cooling liquid to form a vapor, the condenser is configured to condense the vapor into a liquid form.

10. The immersion cooling system of claim 9, further comprising:
a display device signally connected with the water detector and configured to display whether the water detector detects the existence of water.

11. The immersion cooling system of claim 9, wherein the isolation plate comprises a first subsidiary isolation plate and a second subsidiary isolation plate perpendicularly connected with the first subsidiary isolation plate, the first subsidiary isolation plate and the base plate are separated from each other, and the second subsidiary isolation plate and the base plate are connected with each other.

12. The immersion cooling system of claim 9, wherein the isolation plate is substantially perpendicular to the base plate.

13. The immersion cooling system of claim 9, wherein the condenser comprises an input port, an output port and a main body, the input port and the output port are respectively communicated with the main body, the input port is configured to allow a cooling water to flow into the main body, the output port is configured to allow the cooling water to flow away from the main body, and the main body is configured to condense the vapor into the liquid form.

14. An immersion cooling system, comprising:
a tank defining a space configured to accommodate a cooling liquid;
an isolation plate comprising a first subsidiary isolation plate and a second subsidiary isolation plate respectively connected with one of inner walls of the tank, the first subsidiary isolation plate and the second subsidiary isolation plate being connected with each other to form an included angle, the first subsidiary isolation plate being separated from a bottom of the tank to form a through hole therebetween, the second subsidiary isolation plate being connected with the bottom of the tank, the isolation plate dividing the space into a first subsidiary space and a second subsidiary space communicated with the first subsidiary space via the through hole, the first subsidiary space being configured to accommodate at least one electronic equipment such that the at least one electronic equipment is immersed in the cooling liquid;
a supporting piece connected between the first subsidiary isolation plate and the bottom of the tank;
a condenser located at least partially in an upper portion of the second subsidiary space in the tank; and
a water detector connected with one of the inner walls and located within the second subsidiary space, the water detector being configured to detect an existence of water,
wherein the at least one electronic equipment evaporates a portion of the cooling liquid to form a vapor, the condenser is configured to condense the vapor into a liquid form.

* * * * *